US011236248B2

(12) United States Patent
Kagan et al.

(10) Patent No.: US 11,236,248 B2
(45) Date of Patent: Feb. 1, 2022

(54) METALLIC PIGMENT PARTICLES

(71) Applicant: HP Indigo B.V., Amstelveen (NL)

(72) Inventors: Olga Kagan, Nes Ziona (IL); Yaron Grinwald, Nes Ziona (IL); Rada Nuchimov, Nes Ziona (IL); Shiran Zabar, Nes Ziona (IL); Eyal Negreanu, Nes Ziona (IL); Guy Nesher, Nes Ziona (IL)

(73) Assignee: HP Indigo B.V., Amstelveen (NL)

( * ) Notice: Subject to any disclaimer, the term of this patent is extended or adjusted under 35 U.S.C. 154(b) by 0 days.

(21) Appl. No.: 16/064,858

(22) PCT Filed: Mar. 4, 2016

(86) PCT No.: PCT/EP2016/054698
§ 371 (c)(1),
(2) Date: Jun. 21, 2018

(87) PCT Pub. No.: WO2017/148537
PCT Pub. Date: Sep. 8, 2017

(65) Prior Publication Data
US 2018/0371279 A1 Dec. 27, 2018

(51) Int. Cl.
*G03G 9/08* (2006.01)
*G03G 9/12* (2006.01)
(Continued)

(52) U.S. Cl.
CPC ............ *C09D 11/52* (2013.01); *C09D 11/037* (2013.01); *C09D 11/107* (2013.01);
(Continued)

(58) Field of Classification Search
CPC .............................. G03G 9/122; G03G 9/081
See application file for complete search history.

(56) References Cited

U.S. PATENT DOCUMENTS

| 3,770,637 A | * | 11/1973 | Okuno | G03G 9/08 |
| | | | | 430/114 |
| 6,979,523 B1 | * | 12/2005 | Landa | G03G 9/09 |
| | | | | 430/109.1 |

(Continued)

FOREIGN PATENT DOCUMENTS

| CN | 103205162 | 7/2013 |
| JP | H07064348 | 3/1995 |

(Continued)

OTHER PUBLICATIONS

International Search Report dated Oct. 31, 2016 for PCT/EP2016/054698, Applicant Hewlett-Packard Indigo B.V.

*Primary Examiner* — Duane Smith
*Assistant Examiner* — Boone Alexander Evans
(74) *Attorney, Agent, or Firm* — Thorpe North & Western LLP (57) ABSTRACT

A method for producing a conductive liquid electrophotographic ink composition is described, the method comprising: heating a polymer resin in a carrier fluid to dissolve the polymer resin; adding conductive metallic pigment particles to be coated to the carrier fluid; cooling the carrier fluid to effect precipitation of the polymer resin from the carrier fluid such that a coating of the resin is at least partially formed on the conductive metallic pigment particles; reheating the suspension of partially coated conductive metallic pigment particles in the carrier fluid; and cooling the carrier fluid at a controlled rate to effect precipitation of the polymer resin from the carrier fluid such that a coating of the resin is formed on the conductive metallic pigment particles, thereby producing the conductive liquid electrophotographic ink composition.

16 Claims, 2 Drawing Sheets

(51) Int. Cl.
  *G03G 9/13* (2006.01)
  *G03G 9/135* (2006.01)
  *C09D 11/52* (2014.01)
  *H05K 1/09* (2006.01)
  *C09D 11/037* (2014.01)
  *C09D 11/107* (2014.01)

(52) U.S. Cl.
  CPC ........... *G03G 9/0804* (2013.01); *G03G 9/122* (2013.01); *G03G 9/131* (2013.01); *G03G 9/135* (2013.01); *H05K 1/097* (2013.01); *H05K 2201/0224* (2013.01); *H05K 2203/0517* (2013.01)

(56) References Cited

U.S. PATENT DOCUMENTS

| | | | | |
|---|---|---|---|---|
| 7,670,742 | B2 * | 3/2010 | Tsubuko | C09D 11/36 430/114 |
| 8,313,572 | B2 | 11/2012 | Oyanagi et al. | |
| 8,507,096 | B2 | 8/2013 | Takano et al. | |
| 8,916,068 | B2 | 12/2014 | Sato et al. | |
| 9,550,903 | B2 * | 1/2017 | Mor | C09C 3/10 |
| 9,946,183 | B2 * | 4/2018 | Agata | G03G 9/135 |
| 2007/0076072 | A1 * | 4/2007 | Kakino | C09D 11/36 347/100 |
| 2010/0063203 | A1 | 3/2010 | Sato et al. | |
| 2011/0256449 | A1 | 10/2011 | Mao | |
| 2011/0281032 | A1 * | 11/2011 | Kagata | C09D 11/322 427/256 |
| 2013/0066006 | A1 * | 3/2013 | Miyajima | C09D 11/102 524/497 |
| 2013/0288176 | A1 * | 10/2013 | Ganapathiappan | G03G 9/122 430/112 |
| 2014/0063590 | A1 * | 3/2014 | Myoung | G02F 1/167 359/296 |
| 2014/0065079 | A1 * | 3/2014 | To | C09F 1/02 424/52 |
| 2015/0004325 | A1 | 1/2015 | Walker et al. | |
| 2015/0175826 | A1 * | 6/2015 | Mor | C09C 3/10 252/512 |
| 2015/0316868 | A1 * | 11/2015 | Ganapathiappan | G03G 9/122 430/114 |

FOREIGN PATENT DOCUMENTS

| | | |
|---|---|---|
| JP | 2006039442 | 2/2006 |
| JP | 2012207069 | 10/2012 |
| KR | 101519833 | 5/2015 |
| WO | 2013103346 | 7/2013 |
| WO | 2014012597 | 1/2014 |
| WO | 2016012074 | 1/2016 |
| WO | 2016015755 | 2/2016 |
| WO | 2016015757 | 2/2016 |

* cited by examiner

METALLIC PIGMENT PARTICLES

BACKGROUND

Electrostatic printing processes typically involve creating an image on a photoconductive surface, applying an ink having charged particles to the photoconductive surface, such that they selectively bind to the image, and then transferring the charged particles in the form of the image to a print substrate.

The photoconductive surface is typically on a cylinder and is often termed a photo imaging plate (PIP). The photoconductive surface is selectively charged with a latent electrostatic image having image and background areas with different potentials. For example, an electrostatic ink composition comprising charged toner particles in a carrier liquid can be brought into contact with the selectively charged photoconductive surface. The charged toner particles adhere to the image areas of the latent image while the background areas remain clean. The image is then transferred to a print substrate (e.g. paper) directly or, more commonly, by being first transferred to an intermediate transfer member, which can be a soft swelling blanket, and then to the print substrate.

DETAILED DESCRIPTION

Figure 1A:
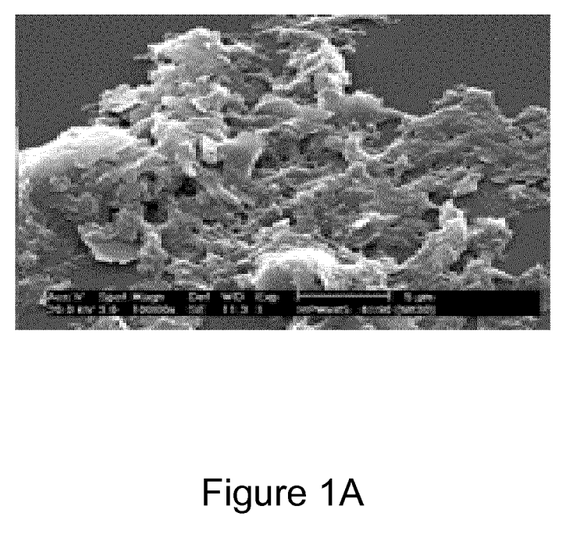
FIG. 1A shows an SEM image of a coated metallic pigment particle prepared by the methods described herein.
Figure 1B:
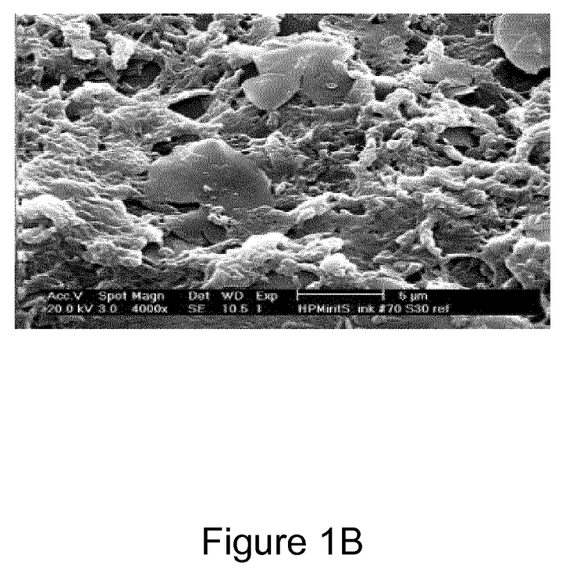
FIG. 1B shows an SEM image of a coated metallic pigment particle prepared by a grinding method.
Figure 2:
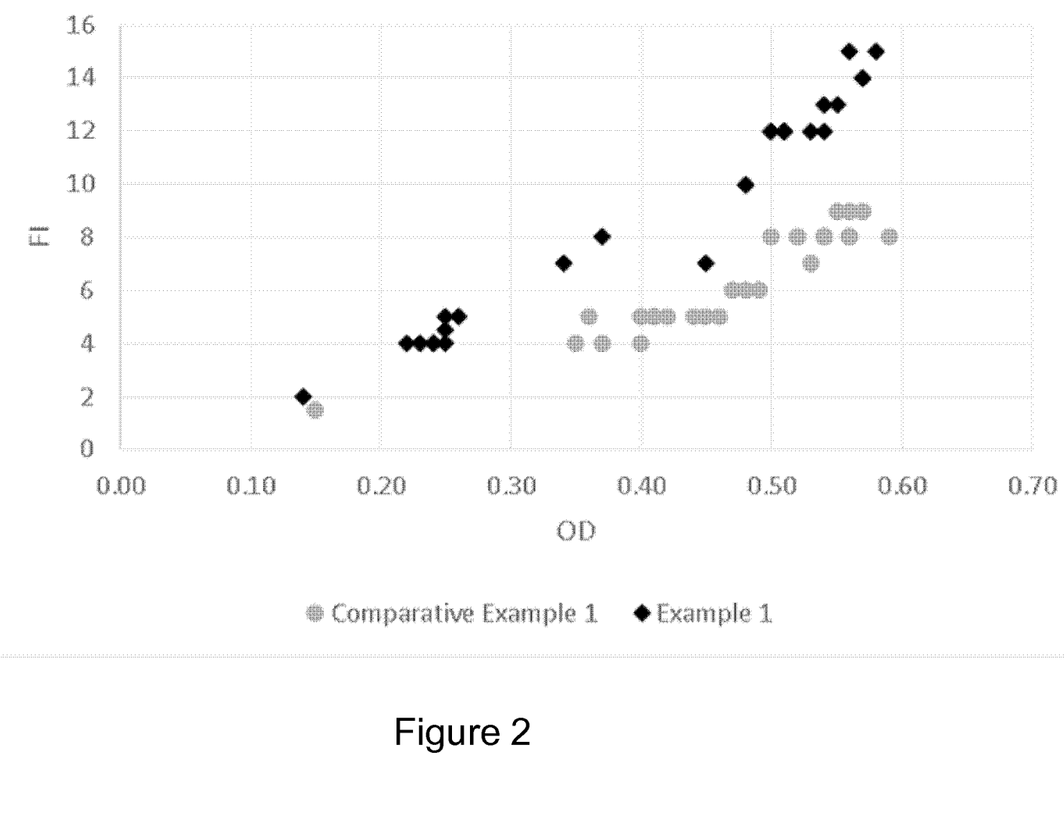
FIG. 2 shows flop index and optical density results of printed inks comprising the particles of FIGS. 1A and 1B.

Before the present disclosure is disclosed and described, it is to be understood that this disclosure is not limited to the particular process steps and materials disclosed herein because such process steps and materials may vary somewhat. It is also to be understood that the terminology used herein is used for the purpose of describing particular embodiments. The terms are not intended to be limiting because the scope is intended to be limited by the appended claims and equivalents thereof.

It is noted that, as used in this specification and the appended claims, the singular forms "a," "an," and "the" include plural referents unless the context clearly dictates otherwise.

As used herein, "carrier fluid", "carrier liquid," "carrier," or "carrier vehicle" refers to the fluid in which polymers, pigment particles, colorant, charge directors and other additives can be dispersed to form a liquid electrostatic composition or electrophotographic composition. The carrier liquids may include a mixture of a variety of different agents, such as surfactants, co-solvents, viscosity modifiers, and/or other possible ingredients.

As used herein, "electrostatic ink composition" or "liquid electrophotographic composition" generally refers to an ink composition that is typically suitable for use in an electrostatic printing process, sometimes termed an electrophotographic printing process. It may comprise pigment particles, which may comprise a thermoplastic resin.

As used herein, "co-polymer" refers to a polymer that is polymerized from at least two monomers.

A certain monomer may be described herein as constituting a certain weight percentage of a polymer. This indicates that the repeating units formed from the said monomer in the polymer constitute said weight percentage of the polymer.

As used herein, "electrostatic printing" or "electrophotographic printing" generally refers to the process that provides an image that is transferred from a photo imaging substrate either directly, or indirectly via an intermediate transfer member, to a print substrate. As such, the image is not substantially absorbed into the photo imaging substrate on which it is applied. Additionally, "electrophotographic printers" or "electrostatic printers" generally refer to those printers capable of performing electrophotographic printing or electrostatic printing, as described above. "Liquid electrophotographic printing" is a specific type of electrophotographic printing where a liquid ink is employed in the electrophotographic process rather than a powder toner. An electrostatic printing process may involve subjecting the electrostatic ink composition to an electric field, e.g. an electric field having a field gradient of 50-400V/μm, or more, in some examples 600-900V/μm, or more, in some examples 1000 V/cm or more, or in some examples 1500 V/cm or more.

As used herein, "melt flow rate" generally refers to the extrusion rate of a resin through an orifice of defined dimensions at a specified temperature and load, usually reported as temperature/load, e.g. 190° C./2.16 kg. Flow rates can be used to differentiate grades or provide a measure of degradation of a material as a result of molding. In the present disclosure, "melt flow rate" is measured per ASTM D1238-04c Standard Test Method for Melt Flow Rates of Thermoplastics by Extrusion Plastometer, as known in the art. If a melt flow rate of a particular polymer is specified, unless otherwise stated, it is the melt flow rate for that polymer alone, in the absence of any of the other components of the electrostatic composition.

As used herein, "acidity," "acid number," or "acid value" refers to the mass of potassium hydroxide (KOH) in milligrams that neutralizes one gram of a substance. The acidity of a polymer can be measured according to standard techniques, for example as described in ASTM D1386. If the acidity of a particular polymer is specified, unless otherwise stated, it is the acidity for that polymer alone, in the absence of any of the other components of the liquid toner composition.

As used herein, "melt viscosity" generally refers to the ratio of shear stress to shear rate at a given shear stress or shear rate. Testing is generally performed using a capillary rheometer. A plastic charge is heated in the rheometer barrel and is forced through a die with a plunger. The plunger is pushed either by a constant force or at constant rate depending on the equipment. Measurements are taken once the system has reached steady-state operation. One method used is measuring Brookfield viscosity @ 140° C., units are mPa-s or cPoise, as known in the art. Alternatively, the melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate. If the melt viscosity of a particular polymer is specified, unless otherwise stated, it is the melt viscosity for that polymer alone, in the absence of any of the other components of the electrostatic composition.

As used herein, "low field conductivity" refers to the electrical conductivity of an ink and is measured by applying a constant amplitude AC voltage to two parallel electrodes and monitoring the current via the fluid. Since the conductivity per definition is proportional to the current and inversely proportional to the voltage inducing the current, the conductivity can be calculated by multiplying the current by a factor depending only on the constant values of the voltage amplitude and geometric parameters, i.e. electrodes surface and distance between the electrodes. The present low field conductivities were measured at the following conditions: electrical field amplitude: 5-15 V/mm, frequency: 5-15 Hz, and temperature: 23+/−2 C.

As used herein, "high field conductivity" refers to the maximum electrical conductivity of the ink measured at the following conditions: electrical field pulse—shape: rectangular; height: 1500 V/mm; duration: 8 sec, rise time: 1 ms or less; ripple: 10 V/mm or less; sampling frequency: 1000 per second; and temperature: 23+/−2 C.

As used herein, "direct conductivity" refers to the average conductivity of the ink measured between 6.4 and 7.2 seconds and was measured by applying a constant high voltage to two parallel electrodes and monitoring the current via the fluid. Since the conductivity per definition is proportional to the current and inversely proportional to the voltage inducing the current, the conductivity can be calculated by multiplying the current by a factor depending only on the constant values of the voltage amplitude and geometric parameters, i.e. electrodes surface and distance between the electrodes. The conductivity of the ink measured in constant electrical field is varying (actually declining) with time. As such, the maximum value of the conductivity is defined as the "high field conductivity" as noted above, and the "direct conductivity" is the conductivity at the tail of the conductivity vs. time curve when the conductivity has leveled off.

As used herein, "particle conductivity" refers to the difference between the high field conductivity and the low field conductivity as defined above. The particle conductivity is proportional to the ink particle properties; i.e., mobility and electrical charge created on the particles.

If a standard test is mentioned herein, unless otherwise stated, the version of the test to be referred to is the most recent at the time of filing this patent application.

As used herein, "NVS" is an abbreviation of the term "non-volatile solids".

As used herein, "cooling without restriction" or "cooling at an uncontrolled rate" generally refers to cooling at a rate faster than about 10° C./hour, for example at least about 20° C./hour, and may include cooling via heat exchange with one or more cooling fluids or refrigerants. In contrast, and as used herein, "cooling at a controlled rate" generally refers to cooling at a rate of between 3 and 7° C. Cooling at a controlled rate may also include cooling via heat exchange with one or more cooling fluids or refrigerants.

As used herein, the term "about" is used to provide flexibility to a numerical range endpoint by providing that a given value may be a little above or a little below the endpoint to allow for variation in test methods or apparatus. The degree of flexibility of this term can be dictated by the particular variable and would be within the knowledge of those skilled in the art to determine based on experience and the associated description herein. As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not just the numerical values explicitly recited as the limits of the range, but also to include all the individual numerical values or sub-ranges encompassed within that range as if each numerical value and sub-range is explicitly recited. As an illustration, a numerical range of "about 1 wt % to about 5 wt %" should be interpreted to include not just the explicitly recited values of about 1 wt % to about 5 wt %, but also include individual values and subranges within the indicated range. Thus, included in this numerical range are individual values such as 2, 3.5, and 4 and sub-ranges such as from 1-3, from 2-4, and from 3-5, etc. This same principle applies to ranges reciting a single numerical value. Furthermore, such an interpretation should apply regardless of the breadth of the range or the characteristics being described.

As used herein, wt % values are to be taken as referring to a weight-for-weight (w/w) percentage of solids in the ink composition, and not including the weight of any carrier fluid present.

Unless otherwise stated, any feature described herein can be combined with any aspect or any other feature described herein.

In an aspect there is provided a method for producing a conductive liquid electrophotographic ink composition, the method comprising:
  heating a polymer resin in a carrier fluid to dissolve the polymer resin;
  adding conductive metallic pigment particles to be coated to the carrier fluid;
  cooling the carrier fluid to effect precipitation of the polymer resin from the carrier fluid such that a coating of the resin is at least partially formed on the conductive metallic pigment particles;
  reheating the suspension of partially coated conductive metallic pigment particles in the carrier fluid; and
  cooling the carrier fluid at a controlled rate to effect precipitation of the polymer resin from the carrier fluid such that a coating of the resin is formed on the conductive metallic pigment particles, thereby producing the conductive liquid electrophotographic ink composition.

In another aspect there is provided conductive metallic pigment particles having a coating thereon producible in accordance with the method comprising:
  heating a polymer resin in a carrier fluid to dissolve the polymer resin;
  adding conductive metallic pigment particles to be coated to the carrier fluid;
  cooling the carrier fluid to effect precipitation of the polymer resin from the carrier fluid such that a coating of the resin is at least partially formed on the conductive metallic pigment particles;
  reheating the suspension of partially coated conductive metallic pigment particles in the carrier fluid; and
  cooling the carrier fluid at a controlled rate to effect precipitation of the polymer resin from the carrier fluid such that a coating of the resin is formed on the conductive metallic pigment particles.

In another aspect there is provided an electrophotographic ink composition, the composition comprising coated conductive metallic pigment particles producible by a method as described herein.

Much research has been carried out in recent years to try to create a silver-look electrostatic printing ink. Some electrostatic printing inks have been produced, e.g. by grinding a metallic pigment with a resin, sometimes in the presence of a liquid carrier. However, some of such inks have been found to have an insufficient and inconsistent metallic appearance, have a high level of background when printed, result in a low lifespan of binary ink development units, photoimaging plate and intermediate transfer members, sometimes form streaks on printing, print at relatively high voltages and currents, and/or sometimes display non-electrostatic ink-like behaviour. The present inventors have found that examples of the method as described herein avoid or at least mitigate at least one of the difficulties described above. They have found that examples of the method are more successful in encapsulating conductive pigment particles and that the pigment particles have less of a tendency to deform during the production process.

Conductive Metallic Pigment

The conductive metallic pigment, in the present application, indicates an electrically conductive metallic pigment. The conductive metallic pigment comprises a metal. The metal may be a metal in elemental form or an alloy of two or more metals. The conductive metallic pigment may comprise a metal selected from aluminium, tin, a transition metal, and alloys of any one of more thereof. The transition metal may be selected from, for example, zinc, copper, silver, gold, nickel, palladium, platinum, and iron. Alloys that may be used include, but are not limited to, brass, bronze, steel and chromium.

The conductive metallic pigment, in any of the aspects herein, may have any three-dimensional shape. In some examples, the conductive metallic pigment is in the form selected from a flake, a sphere, a rod, or approximations thereof. In the present application, a flake may be a shape with a first dimension, which may be termed a thickness, less than the other two dimensions. In some examples, the flake has a thickness of at least 0.01 µm, in some examples a thickness of at least 0.05 µm, in some examples a thickness of at least 0.05 µm, in some examples a thickness of at least 0.1 µm, in some examples a thickness of at least 0.15 µm, in some examples a thickness of at least 0.18 µm. In some examples, the flake has a thickness of 1 µm or less, in some examples a thickness of 0.8 µm or less, in some examples a thickness of 0.5 µm or less, in some examples a thickness of 0.4 µm or less, in some examples a thickness of 0.3 µm or less.

In some examples, the flake has a diameter, measured in a direction perpendicular to the thickness and excluding any coating on the flake, of at least 1 µm, in some examples a diameter of at least 2 µm, in some examples a diameter of at least 3 µm, in some examples a diameter of at least 4 µm, in some examples a diameter of at least 5 µm, in some examples a diameter of at least 6 µm, in some examples a diameter of at least 7 µm, in some examples a diameter of at least 8 µm. In some examples, the flake has a diameter, measured in a direction perpendicular to the thickness, of 50 µm or less, in some examples a diameter of 40 µm or less, in some examples a diameter of 30 µm or less, in some examples a diameter of 20 µm or less, in some examples a diameter of 15 µm or less.

In some examples, the conductive metallic pigment, excluding any coating thereon, has an aspect ratio of a diameter (measured in a direction perpendicular to the thickness) to its thickness of n:1, where n is at least 2, in some examples at least 5, in some examples at least 10, in some examples at least 20, in some examples at least 30, in some examples at least 35. In some examples, the conductive metallic pigment has an aspect ratio of a diameter (measured in a direction perpendicular to the thickness) to its thickness of n:1, where n is 100 or less, in some examples n is 80 or less, in some examples n is 70 or less, in some examples n is 60 or less, in some examples n is 50 or less.

Unless otherwise stated, the particle size of the pigment particle and the coated pigment particle is determined using laser diffraction on a Malvern Mastersizer 2000 according to the standard procedure as described in the operating manual.

The pigment particle may be present in the method and/or electrostatic ink composition in an amount of from 10 wt % to 80 wt % of the total amount of resin and pigment, in some examples 15 wt % to 80 wt %, in some examples 15 wt % to 60 wt %, in some examples 15 wt % to 50 wt %, in some examples 15 wt % to 40 wt %, in some examples 15 wt % to 30 wt % of the total amount of resin and pigment. In some examples, the pigment particle may be present in the method and/or electrostatic ink composition in an amount of at least 50 wt % of the total amount of resin and pigment, for example at least 55 wt % of the total amount of resin and pigment.

In some examples, the conductive metallic pigments, excluding any coating thereon, constitute 25% or less by weight of the solids in the electrostatic ink composition or composition resulting from the method, which may be an electrostatic ink composition. In some examples, the conductive metallic pigments, excluding any coating thereon, constitute 12% or less by weight, in some examples 10% or less by weight, in some examples 8% or less by weight of the solids in the electrostatic ink composition or composition resulting from the method, which may be an electrostatic ink composition.

In some examples, the conductive metallic pigments, excluding any coating thereon, constitute 1% or more by weight, in some examples 2% or more by weight, in some examples 4% or more by weight, in some examples 6% or more by weight by weight, in some examples 8% or more by weight, of the solids in the electrostatic ink composition or composition resulting from the method, which may be an electrostatic ink composition.

Polymer Resin

The encapsulated conductive metallic pigment can comprise a resin, for example a polymer resin. The polymer resin may comprise a thermoplastic polymer. A thermoplastic polymer is sometimes referred to as a thermoplastic resin. In some examples, the polymer may be selected from ethylene or propylene acrylic acid co-polymers; ethylene or propylene methacrylic acid co-polymers; ethylene vinyl acetate co-polymers; co-polymers of ethylene or propylene (e.g. 80 wt % to 99.9 wt %), and alkyl (e.g. C1 to C5) ester of methacrylic or acrylic acid (e.g. 0.1 wt % to 20 wt %); co-polymers of ethylene (e.g. 80 wt % to 99.9 wt %), acrylic or methacrylic acid (e.g. 0.1 wt % to 20.0 wt %) and alkyl (e.g. C1 to C5) ester of methacrylic or acrylic acid (e.g. 0.1 wt % to 20 wt %); co-polymers of ethylene or propylene (e.g. 70 wt % to 99.9 wt %) and maleic anhydride (e.g. 0.1 wt % to 30 wt %); polyethylene; polystyrene; isotactic polypropylene (crystalline); co-polymers of ethylene ethylene ethyl acrylate; polyesters; polyvinyl toluene; polyamides; styrene/butadiene co-polymers; epoxy resins; acrylic resins (e.g. co-polymer of acrylic or methacrylic acid and at least one alkyl ester of acrylic or methacrylic acid wherein alkyl may have from 1 to about 20 carbon atoms, such as methyl methacrylate (e.g. 50% to 90%)/methacrylic acid (e.g. 0 wt % to 20 wt %)/ethylhexylacrylate (e.g. 10 wt % to 50 wt %)); ethylene-acrylate terpolymers: ethylene-acrylic esters-maleic anhydride (MAH) or glycidyl methacrylate (GMA) terpolymers; ethylene-acrylic acid ionomers and combinations thereof.

The resin may comprise a polymer having acidic side groups. Examples of the polymer having acidic side groups will now be described. The polymer having acidic side groups may have an acidity of 50 mg KOH/g or more, in some examples an acidity of 60 mg KOH/g or more, in some examples an acidity of 70 mg KOH/g or more, in some examples an acidity of 80 mg KOH/g or more, in some examples an acidity of 90 mg KOH/g or more, in some examples an acidity of 100 mg KOH/g or more, in some examples an acidity of 105 mg KOH/g or more, in some examples 110 mg KOH/g or more, in some examples 115 mg KOH/g or more. The polymer having acidic side groups may have an acidity of 200 mg KOH/g or less, in some examples 190 mg or less, in some examples 180 mg or less, in some examples 130 mg KOH/g or less, in some examples 120 mg KOH/g or less. Acidity of a polymer, as measured in mg KOH/g can be measured using standard procedures known in the art, for example using the procedure described in ASTM D1386.

The resin may comprise a polymer, in some examples a polymer having acidic side groups, that has a melt flow rate of less than about 70 g/10 minutes, in some examples about 60 g/10 minutes or less, in some examples about 50 g/10 minutes or less, in some examples about 40 g/10 minutes or less, in some examples 30 g/10 minutes or less, in some examples 20 g/10 minutes or less, in some examples 10 g/10 minutes or less. In some examples, all polymers having acidic side groups and/or ester groups in the particles each individually have a melt flow rate of less than 90 g/10 minutes, 80 g/10 minutes or less, in some examples 80 g/10 minutes or less, in some examples 70 g/10 minutes or less, in some examples 70 g/10 minutes or less, in some examples 60 g/10 minutes or less.

The polymer having acidic side groups can have a melt flow rate of about 10 g/10 minutes to about 120 g/10 minutes, in some examples about 10 g/10 minutes to about 70 g/10 minutes, in some examples about 10 g/10 minutes to 40 g/10 minutes, in some examples 20 g/10 minutes to 30 g/10 minutes. The polymer having acidic side groups can have a melt flow rate of, in some examples, about 50 g/10 minutes to about 120 g/10 minutes, in some examples 60 g/10 minutes to about 100 g/10 minutes. The melt flow rate can be measured using standard procedures known in the art, for example as described in ASTM D1238.

The acidic side groups may be in free acid form or may be in the form of an anion and associated with one or more counterions, typically metal counterions, e.g. a metal selected from the alkali metals, such as lithium, sodium and potassium, alkali earth metals, such as magnesium or calcium, and transition metals, such as zinc. The polymer having acidic sides groups can be selected from resins such as co-polymers of ethylene and an ethylenically unsaturated acid of either acrylic acid or methacrylic acid; and ionomers thereof, such as methacrylic acid and ethylene-acrylic or methacrylic acid co-polymers which are at least partially neutralized with metal ions (e.g. Zn, Na, Li) such as SURLYN® ionomers. The polymer comprising acidic side groups can be a co-polymer of ethylene and an ethylenically unsaturated acid of either acrylic or methacrylic acid, where the ethylenically unsaturated acid of either acrylic or methacrylic acid constitute from 5 wt % to about 25 wt % of the co-polymer, in some examples from 10 wt % to about 20 wt % of the co-polymer.

The resin may comprise two different polymers having acidic side groups. The two polymers having acidic side groups may have different acidities, which may fall within the ranges mentioned above. The resin may comprise a first polymer having acidic side groups that has an acidity of from 10 mg KOH/g to 110 mg KOH/g, in some examples 20 mg KOH/g to 110 mg KOH/g, in some examples 30 mg KOH/g to 110 mg KOH/g, in some examples 50 mg KOH/g to 110 mg KOH/g, and a second polymer having acidic side groups that has an acidity of 110 mg KOH/g to 130 mg KOH/g.

The resin may comprise two different polymers having acidic side groups: a first polymer having acidic side groups that has a melt flow rate of about 10 g/10 minutes to about 50 g/10 minutes and an acidity of from 10 mg KOH/g to 110 mg KOH/g, in some examples 20 mg KOH/g to 110 mg KOH/g, in some examples 30 mg KOH/g to 110 mg KOH/g, in some examples 50 mg KOH/g to 110 mg KOH/g, and a second polymer having acidic side groups that has a melt flow rate of about 50 g/10 minutes to about 120 g/10 minutes and an acidity of 110 mg KOH/g to 130 mg KOH/g. The first and second polymers may be absent of ester groups.

The resin may comprise two different polymers having acidic side groups that are selected from copolymers of ethylene and an ethylenically unsaturated acid of either methacrylic acid or acrylic acid; and ionomers thereof, such as methacrylic acid and ethylene-acrylic or methacrylic acid copolymers which are at least partially neutralized with metal ions (e.g. Zn, Na, Li) such as SURLYN® ionomers. The resin may comprise (i) a first polymer that is a copolymer of ethylene and an ethylenically unsaturated acid of either acrylic acid and methacrylic acid, wherein the ethylenically unsaturated acid of either acrylic or methacrylic acid constitutes from 8 wt % to about 16 wt % of the copolymer, in some examples 10 wt % to 16 wt % of the copolymer; and (ii) a second polymer that is a copolymer of ethylene and an ethylenically unsaturated acid of either acrylic acid and methacrylic acid, wherein the ethylenically unsaturated acid of either acrylic or methacrylic acid constitutes from 12 wt % to about 30 wt % of the copolymer, in some examples from 14 wt % to about 20 wt % of the copolymer, in some examples from 16 wt % to about 20 wt % of the copolymer in some examples from 17 wt % to 19 wt % of the copolymer.

The resin may comprise two different polymers having acidic side groups: a first polymer that is a copolymer of ethylene (e.g. 92 to 85 wt %, in some examples about 89 wt %) and acrylic or methacrylic acid (e.g. 8 to 15 wt %, in some examples about 11 wt %) having a melt flow rate of 80 to 110 g/10 minutes and a second polymer that is a co-polymer of ethylene (e.g. about 80 to 92 wt %, in some examples about 85 wt %) and acrylic acid (e.g. about 18 to 12 wt %, in some examples about 15 wt %), having a melt viscosity lower than that of the first polymer, the second polymer for example having a melt viscosity of 15000 poise or less, in some examples a melt viscosity of 10000 poise or less, in some examples 1000 poise or less, in some examples 100 poise or less, in some examples 50 poise or less, in some examples 10 poise or less. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate.

In any of the examples mentioned above, the ratio of the first polymer having acidic side groups to the second polymer having acidic side groups can be from about 10:1 to about 2:1. In another example, the ratio can be from about 6:1 to about 3:1, in some examples about 4:1.

The resin may comprise a polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; said polymer may be a polymer having acidic side groups as described herein. The resin may comprise a first polymer having a melt viscosity of 15000 poise or more, in some examples 20000 poise or more, in some examples 50000 poise or more, in some examples 70000 poise or more; and in some examples, the resin may comprise a second polymer having a melt viscosity less than the first polymer, in some examples a melt viscosity of 15000 poise or less, in some examples a melt viscosity of 10000 poise or less, in some examples 1000 poise or less, in some examples 100 poise or less, in some examples 50 poise or less, in some examples 10 poise or less. The resin may comprise a first polymer having a melt viscosity of more than 60000 poise, in some examples from 60000 poise to 100000 poise, in some examples from 65000 poise to 85000 poise; a second polymer having a melt viscosity of from 15000 poise to 40000 poise, in some examples 20000 poise to 30000 poise, and a third polymer having a melt viscosity of 15000 poise or less, in some examples a melt viscosity of 10000 poise or less, in some examples 1000 poise or less, in some examples 100 poise or less, in some examples 50 poise or less, in some examples 10 poise or less; an example of the first polymer is Nucrel 960 (from DuPont), and example of the second polymer is Nucrel 699 (from DuPont), and an example of the third polymer is AC-5120 or AC-5180 (from Honeywell). The first, second and third polymers may be polymers having acidic side groups as described herein. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate. If the resin comprises a single type of polymer, the polymer (excluding any other components of the electrophotographic ink composition) may have a melt viscosity of 6000 poise or more, in some examples a melt viscosity of 8000 poise or more, in some examples a melt viscosity of 10000 poise or more, in some examples a melt viscosity of 12000 poise or more. If the resin comprises a plurality of polymers all the polymers of the resin may together form a mixture (excluding any other components of the electrophotographic ink composition) that has a melt viscosity of 6000 poise or more, in some examples a melt viscosity of 8000 poise or more, in some examples a melt viscosity of 10000 poise or more, in some examples a melt viscosity of 12000 poise or more. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 Hz shear rate.

If the resin comprises a single type of resin polymer, the resin polymer (excluding any other components of the electrostatic ink composition) may have a melt viscosity of 6000 poise or more, in some examples a melt viscosity of 8000 poise or more, in some examples a melt viscosity of 10000 poise or more, in some examples a melt viscosity of 12000 poise or more. If the resin comprises a plurality of polymers all the polymers of the resin may together form a mixture (excluding any other components of the electrostatic ink composition) that has a melt viscosity of 6000 poise or more, in some examples a melt viscosity of 8000 poise or more, in some examples a melt viscosity of 10000 poise or more, in some examples a melt viscosity of 12000 poise or more. Melt viscosity can be measured using standard techniques. The melt viscosity can be measured using a rheometer, e.g. a commercially available AR-2000 Rheometer from Thermal Analysis Instruments, using the geometry of: 25 mm steel plate-standard steel parallel plate, and finding the plate over plate rheometry isotherm at 120° C., 0.01 hz shear rate.

The resin may comprise a polymer having acidic side groups, as described above (which may be free of ester side groups), and a polymer having ester side groups. The polymer having ester side groups may be a thermoplastic polymer. The polymer having ester side groups may further comprise acidic side groups. The polymer having ester side groups may be a co-polymer of a monomer having ester side groups and a monomer having acidic side groups. The polymer may be a co-polymer of a monomer having ester side groups, a monomer having acidic side groups, and a monomer absent of any acidic and ester side groups. The monomer having ester side groups may be a monomer selected from esterified acrylic acid or esterified methacrylic acid. The monomer having acidic side groups may be a monomer selected from acrylic or methacrylic acid. The monomer absent of any acidic and ester side groups may be an alkylene monomer, including, but not limited to, ethylene or propylene. The esterified acrylic acid or esterified methacrylic acid may, respectively, be an alkyl ester of acrylic acid or an alkyl ester of methacrylic acid. The alkyl group in the alkyl ester of acrylic or methacrylic acid may be an alkyl group having 1 to 30 carbons, in some examples 1 to 20 carbons, in some examples 1 to 10 carbons; in some examples selected from methyl, ethyl, isopropyl, n-propyl, t-butyl, iso-butyl, n-butyl and pentyl.

The polymer having ester side groups may be a co-polymer of a first monomer having ester side groups, a second monomer having acidic side groups and a third monomer which is an alkylene monomer absent of any acidic and ester side groups. The polymer having ester side groups may be a co-polymer of (i) a first monomer having ester side groups selected from esterified acrylic acid or esterified methacrylic acid, in some examples an alkyl ester of acrylic or methacrylic acid, (ii) a second monomer having acidic side groups selected from acrylic or methacrylic acid and (iii) a third monomer which is an alkylene monomer selected from ethylene and propylene. The first monomer may constitute 1% to 50% by weight of the co-polymer, in some examples 5% to 40% by weight, in some examples 5% to 20% by weight of the co-polymer, in some examples 5% to 15% by weight of the co-polymer. The second monomer may constitute 1% to 50% by weight of the co-polymer, in some examples 5% to 40% by weight of the co-polymer, in some examples 5% to 20% by weight of the co-polymer, in some examples 5% to 15% by weight of the co-polymer. The first monomer can constitute 5% to 40% by weight of the co-polymer, the second monomer constitutes 5% to 40% by weight of the co-polymer, and with the third monomer constituting the remaining weight of the co-polymer. In some examples, the first monomer constitutes 5% to 15% by weight of the co-polymer, the second monomer constitutes 5% to 15% by weight of the co-polymer, with the third monomer constituting the remaining weight of the co-polymer. In some examples, the first monomer constitutes 8% to 12% by weight of the co-polymer, the second monomer constitutes 8% to 12% by weight of the co-polymer, with the third monomer constituting the remaining weight of the co-polymer. In some examples, the first monomer constitutes about 10% by weight of the co-polymer, the second monomer constitutes about 10% by weight of the co-polymer, and with the third monomer constituting the remaining weight of the co-polymer. The polymer may be selected from the Bynel® class of monomer, including Bynel 2022 and Bynel 2002, which are available from DuPont®.

The polymer having ester side groups may constitute 1% or more by weight of the total amount of the resin polymers in the resin, e.g. the total amount of the polymer or polymers having acidic side groups and polymer having ester side groups. The polymer having ester side groups may constitute 5% or more by weight of the total amount of the resin polymers in the resin, in some examples 8% or more by weight of the total amount of the resin polymers in the resin, in some examples 10% or more by weight of the total amount of the resin polymers in the resin, in some examples 15% or more by weight of the total amount of the resin polymers in the resin, in some examples 20% or more by weight of the total amount of the resin polymers in the resin, in some examples 25% or more by weight of the total amount of the resin polymers in the resin, in some examples 30% or more by weight of the total amount of the resin polymers in the resin, in some examples 35% or more by weight of the total amount of the resin polymers in the resin. The polymer having ester side groups may constitute from 5% to 50% by weight of the total amount of the resin polymers in the resin, in some examples 10% to 40% by weight of the total amount of the resin polymers in the resin, in some examples 15% to 30% by weight of the total amount of the polymers in the resin.

The polymer having ester side groups may have an acidity of 50 mg KOH/g or more, in some examples an acidity of 60 mg KOH/g or more, in some examples an acidity of 70 mg KOH/g or more, in some examples an acidity of 80 mg KOH/g or more. The polymer having ester side groups may have an acidity of 100 mg KOH/g or less, in some examples 90 mg KOH/g or less. The polymer having ester side groups may have an acidity of 60 mg KOH/g to 90 mg KOH/g, in some examples 70 mg KOH/g to 80 mg KOH/g.

The polymer having ester side groups may have a melt flow rate of about 10 g/10 minutes to about 120 g/10 minutes, in some examples about 10 g/10 minutes to about 50 g/10 minutes, in some examples about 20 g/10 minutes to about 40 g/10 minutes, in some examples about 25 g/10 minutes to about 35 g/10 minutes.

The polymer, polymers, co-polymer or co-polymers of the resin can in some examples be selected from the Nucrel family of toners (e.g. Nucrel 403™, Nucrel 407™, Nucrel 609HS™, Nucrel 908HS™, Nucrel 1202HC™, Nucrel 30707™, Nucrel 1214™, Nucrel 903™, Nucrel 3990™, Nucrel 910™, Nucrel 925™, Nucrel 699™, Nucrel 599™, Nucrel 960™, Nucrel RX76™, Nucrel 2806™, Bynell 2002, Bynell 2014, Bynell 2020 and Bynell 2022, (sold by E. I. du PONT)), the AC family of toners (e.g. AC-5120, AC-5180, AC-540, AC-580 (sold by Honeywell)), the Aclyn family of toners (e.g. Aclyn 201, Aclyn 246, Aclyn 285, and Aclyn 295), and the Lotader family of toners (e.g. Lotader 2210, Lotader, 3430, and Lotader 8200 (sold by Arkema)).

In an example, the resin constitutes about 5 to 90%, in some examples about 5 to 70%, by weight of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition. In another example, the resin constitutes about 10 to 60% by weight of any of (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition. In another example, the resin constitutes about 15 to 40% by weight of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition. In another example, the resin constitutes about 60 to 95% by weight, in some examples from 70 to 90% by weight, in some examples 75 to 85% by weight, of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition.

Carrier Liquid

In some examples, the methods described produce coated pigment particles which are formed in and/or dispersed in a carrier fluid or carrier liquid. Before application to the print substrate in the electrostatic printing process, the composition may be an electrostatic ink composition, which may be in dry form, for example in the form of flowable pigment particles coated with the thermoplastic resin. Alternatively, before application to the print substrate in the electrostatic printing process, the electrostatic ink composition may be in liquid form; and may comprise a carrier liquid in which is suspended conductive metallic pigment particles coated with the thermoplastic resin.

Generally, the carrier liquid acts as a reaction solvent in preparing the coated pigment particles, and can also act as a dispersing medium for the other components in the resulting electrostatic ink composition. In one example, the carrier liquid is a liquid which does not dissolve the polymer resin at room temperature. In one example, the carrier liquid is a liquid which dissolves the polymer resin at elevated temperatures. For example, the polymer resin may be soluble in the carrier liquid when heated to a temperature of at least 80° C., for example 90° C., for example 100° C., for example 110° C., for example 120° C. For example, the carrier liquid can comprise or be a hydrocarbon, silicone oil, vegetable oil, etc. The carrier liquid can include, but is not limited to, an insulating, non-polar, non-aqueous liquid that can be used as a medium for toner particles. The carrier liquid can include compounds that have a resistivity in excess of about $10^9$ ohm-cm. The carrier liquid may have a dielectric constant below about 5, in some examples below about 3. The carrier liquid can include, but is not limited to, hydrocarbons. The hydrocarbon can include, but is not limited to, an aliphatic hydrocarbon, an isomerized aliphatic hydrocarbon, branched chain aliphatic hydrocarbons, aromatic hydrocarbons, and combinations thereof. Examples of the carrier liquids include, but are not limited to, aliphatic hydrocarbons, isoparaffinic compounds, paraffinic compounds, dearomatized hydrocarbon compounds, and the like. In particular, the carrier liquids can include, but are not limited to, Isopar-G™, Isopar-H™, Isopar-L™, Isopar-M™, Isopar-K™, Isopar-V™, Norpar 12™, Norpar 13™, Norpar 15™, Exxol D40™, Exxol D80™, Exxol D100™, Exxol D130™, and Exxol D140™ (each sold by EXXON CORPORATION); Teclen N-16™, Teclen N-20™, Teclen N-22™, Nisseki Naphthesol L™, Nisseki Naphthesol M™, Nisseki Naphthesol H™, #0 Solvent L™, #0 Solvent M™, #0 Solvent H™, Nisseki Isosol 300™, Nisseki Isosol 400™, AF-4™, AF-5™, AF-6™ and AF-7™ (each sold by NIPPON OIL CORPORATION); IP Solvent 1620™ and IP Solvent 2028™ (each sold by IDEMITSU PETROCHEMICAL CO., LTD.); Amsco OMS™ and Amsco 460™ (each sold by AMERICAN MINERAL SPIRITS CORP.); and Electron, Positron, New II, Purogen HF (100% synthetic terpenes) (sold by ECOLINK™).

In the example in which the carrier liquid is acting as a solvent during preparation of the liquid electrophotographic ink composition comprising coated conductive metallic pigment particles, the carrier liquid can constitute about 20% to 99.5% by weight of the composition, in some examples 50% to 99.5% by weight of the composition in the step of coating the particles. In the example in which the carrier liquid is acting as a solvent during preparation of coated pigment particles, the carrier liquid may constitute about 40 to 90% by weight of the composition in the step of coating the particles. In the example in which the carrier liquid is acting as a solvent during preparation of coated pigment particles, the carrier liquid may constitute about 60% to 80% by weight of the composition in the step of coating the particles. In the example in which the carrier liquid is acting as a solvent during preparation of coated pigment particles, the carrier liquid may constitute about 90% to 99.5% by weight of the composition, in some examples 95% to 99% by weight of the composition in the step of coating the particles.

Before printing, the carrier liquid can constitute about 20% to 99.5% by weight of the electrostatic ink composition, in some examples 50% to 99.5% by weight of the electrostatic ink composition. Before printing, the carrier liquid may constitute about 40 to 90% by weight of the electrostatic ink composition. Before printing, the carrier liquid may constitute about 60% to 80% by weight of the electrostatic ink composition. Before printing, the carrier liquid may constitute about 90% to 99.5% by weight of the electrostatic ink composition, in some examples 95% to 99% by weight of the electrostatic ink composition.

The ink, when printed on the print substrate, may be substantially free from carrier liquid. In an electrostatic printing process and/or afterwards, the carrier liquid may be removed, e.g. by an electrophoresis processes during printing and/or evaporation, such that substantially just solids are transferred to the print substrate. Substantially free from carrier liquid may indicate that the ink printed on the print substrate contains less than 5 wt % carrier liquid, in some examples, less than 2 wt % carrier liquid, in some examples less than 1 wt % carrier liquid, in some examples less than 0.5 wt % carrier liquid. In some examples, the ink printed on the print substrate is free from carrier liquid.

Charge Director and Charge Adjuvant

The liquid electrophotographic composition and/or the ink composition printed on the print substrate can comprise a charge director. The method as described here may involve adding a charge director at any stage. A charge director can be added to an electrostatic composition to impart a charge of a desired polarity and/or maintain sufficient electrostatic charge on the particles of an electrostatic ink composition. The charge director may comprise ionic compounds, including, but not limited to, metal salts of fatty acids, metal salts of sulfo-succinates, metal salts of oxyphosphates, metal salts of alkyl-benzenesulfonic acid, metal salts of aromatic carboxylic acids or sulfonic acids, as well as zwitterionic and non-ionic compounds, such as polyoxyethylated alkylamines, lecithin, polyvinylpyrrolidone, organic acid esters of polyvalent alcohols, etc. The charge director can be selected from, but is not limited to, oil-soluble petroleum sulfonates (e.g. neutral Calcium Petronate™, neutral Barium Petronate™, and basic Barium Petronate™), polybutylene succinimides (e.g. OLOA™ 1200 and Amoco 575), and glyceride salts (e.g. sodium salts of phosphated mono- and diglycerides with unsaturated and saturated acid substituents), sulfonic acid salts including, but not limited to, barium, sodium, calcium, and aluminium salts of sulfonic acid. The sulfonic acids may include, but are not limited to, alkyl sulfonic acids, aryl sulfonic acids, and sulfonic acids of alkyl succinates (e.g. see WO 2007/130069). The charge director can impart a negative charge or a positive charge on the resin-coated conductive metallic pigment particles of an electrostatic ink composition.

The charge director can comprise a sulfosuccinate moiety of the general formula $[R_a\text{—O—C(O)CH}_2\text{CH(SO}_3^-\text{)C(O)—O—}R_b]$, where each of $R_a$ and $R_b$ is an alkyl group. In some examples, the charge director comprises nanoparticles of a simple salt and a sulfosuccinate salt of the general formula $MA_n$, wherein M is a metal, n is the valence of M, and A is an ion of the general formula $[R_a\text{—O—C(O)CH}_2\text{CH(SO}_3^-\text{)C(O)—O—}R_b]$, where each of $R_a$ and $R_b$ is an alkyl group, or other charge directors as found in WO2007130069, which is incorporation herein by reference in its entirety. As described in WO2007130069, the sulfosuccinate salt of the general formula $MA_n$ is an example of a micelle forming salt. The charge director may be substantially free or free of an acid of the general formula HA, where A is as described above. The charge director may comprise micelles of said sulfosuccinate salt enclosing at least some of the nanoparticles. The charge director may comprise at least some nanoparticles having a size of 200 nm or less, in some examples 2 nm or more. As described in WO2007130069, simple salts are salts that do not form micelles by themselves, although they may form a core for micelles with a micelle forming salt. The ions constructing the simple salts are all hydrophilic. The simple salt may comprise a cation selected from Mg, Ca, Ba, $NH_4$, tert-butyl ammonium, $Li^+$, and $Al^{+3}$, or from any sub-group thereof. The simple salt may comprise an anion selected from $SO_4^{2-}$, $PO^{3-}$, $NO_3^-$, $HPO_4^{2-}$, $CO_3^{2-}$, acetate, trifluoroacetate (TFA), $Cl^-$, $Bf$, $F^-$, $ClO_4^-$, and $TiO_3^{4-}$, or from any sub-group thereof. The simple salt may be selected from $CaCO_3$, $Ba_2TiO_3$, $Al_2(SO_4)_3$, $Al(NO_3)_3$, $Ca_3(PO_4)_2$, $BaSO_4$, $BaHPO_4$, $Ba_2(PO_4)_3$, $CaSO_4$, $(NH_4)_2CO_3$, $(NH_4)_2SO_4$, $NH_4OAc$, Tert-butyl ammonium bromide, $NH_4NO_3$, LiTFA, $Al_2(SO_4)_3$, $LiClO_4$ and $LiBF_4$, or any sub-group thereof. The charge director may further comprise basic barium petronate (BBP).

In the formula $[R_a\text{—O—C(O)CH}_2\text{CH(SO}_3^-\text{)C(O)—O—}R_b]$, in some examples, each of $R_a$ and $R_b$ is an aliphatic alkyl group. In some examples, each of $R_a$ and $R_b$ independently is a $C_{6-25}$ alkyl. In some examples, said aliphatic alkyl group is linear. In some examples, said aliphatic alkyl group is branched. In some examples, said aliphatic alkyl group includes a linear chain of more than 6 carbon atoms. In some examples, $R_a$ and $R_b$ are the same. In some examples, at least one of $R_a$ and $R_b$ is $C_{13}H_{27}$. In some examples, M is Na, K, Cs, Ca, or Ba. The formula $[R_a\text{—O—C(O)CH}_2\text{CH(SO}_3^-\text{)C(O)—O—}R_b]$ and/or the formula $MA_n$ may be as defined in any part of WO2007130069.

The charge director may comprise (i) soya lecithin, (ii) a barium sulfonate salt, such as basic barium petronate (BPP), and (iii) an isopropyl amine sulfonate salt. Basic barium petronate is a barium sulfonate salt of a 21-26 hydrocarbon alkyl, and can be obtained, for example, from Chemtura. An example isopropyl amine sulphonate salt is dodecyl benzene sulfonic acid isopropyl amine, which is available from Croda.

In some examples, the charge director constitutes about 0.001% to 20%, in some examples 0.01 to 20% by weight, in some examples 0.01 to 10% by weight, in some examples 0.01 to 1% by weight of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition. In some examples, the charge director constitutes about 0.001 to 0.15% by weight of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition, in some examples 0.001 to 0.15%, in some examples 0.001 to 0.02% by weight of any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition.

Charge Adjuvant

The liquid electrophotographic ink composition and/or ink composition printed on the print substrate can include a charge adjuvant. A charge adjuvant may be present with a charge director, and may be different to the charge director, and act to increase and/or stabilise the charge on particles, e.g. resin-containing particles, of an electrostatic composition. The charge adjuvant can include, but is not limited to, barium petronate, calcium petronate, Co salts of naphthenic acid, Ca salts of naphthenic acid, Cu salts of naphthenic acid, Mn salts of naphthenic acid, Ni salts of naphthenic acid, Zn salts of naphthenic acid, Fe salts of naphthenic acid, Ba salts of stearic acid, Co salts of stearic acid, Pb salts of stearic acid, Zn salts of stearic acid, Al salts of stearic acid, Cu salts of stearic acid, Fe salts of stearic acid, metal carboxylates (e.g. Al tristearate, Al octanoate, Li heptanoate, Fe stearate, Fe distearate, Ba stearate, Cr stearate, Mg octanoate, Ca stearate, Fe naphthenate, Zn naphthenate, Mn heptanoate, Zn heptanoate, Ba octanoate, Al octanoate, Co octanoate, Mn octanoate, and Zn octanoate), Co lineolates, Mn lineolates, Pb lineolates, Zn lineolates, Ca oleates, Co oleates, Zn palmirate, Ca resinates, Co resinates, Mn resinates, Pb resinates, Zn resinates, AB diblock co-polymers of 2-ethylhexyl methacrylate-co-methacrylic acid calcium, and ammonium salts, co-polymers of an alkyl acrylamidoglycolate alkyl ether (e.g. methyl acrylamidoglycolate methyl ether-co-vinyl acetate), and hydroxy bis(3,5-di-tert-butyl salicylic) aluminate monohydrate. In some examples, the charge adjuvant is aluminium di and/or tristearate and/or aluminium di and/or tripalmitate.

The charge adjuvant may be present in an amount of about 0.1 to 5, about 0.5 to 4, and about 1 to 3% weight in any of: (i) the solids of the electrostatic ink composition, (ii) the solids of the second portion of the carrier liquid; (iii) the solids of the carrier liquid before precipitation of the resin, (iv) the solids of the composition resulting from the method, which may be an electrostatic ink composition.

Other Additives

The electrophotographic ink composition may include an additive or a plurality of additives. The additive or plurality of additives may be added at any stage of the method. The additive or plurality of additives may be selected from a wax, a surfactant, biocides, organic solvents, viscosity modifiers, materials for pH adjustment, sequestering agents, preservatives, compatibility additives, emulsifiers and the like. The wax may be an incompatible wax. As used herein, "incompatible wax" may refer to a wax that is incompatible with the resin. Specifically, the wax phase separates from the resin phase upon the cooling of the resin fused mixture on a print substrate during and after the transfer of the ink film to the print substrate, e.g. from an intermediate transfer member, which may be a heated blanket.

In some examples a surfactant is present in the any portion of the carrier fluid before, during and/or after effecting precipitation of the resin. In some examples a surfactant is present in the electrostatic ink composition or the composition resulting from the method, which may be an electrostatic ink composition. A surfactant has been found to promote encapsulation of the conductive metallic pigment particles by the resin, which has been found to promote the print properties of resin-coated metallic pigment particles.

Surfactants comprises an acidic group have been found to be particularly effective. Accordingly, in some examples, the surfactant comprises an acidic group. In some examples, the surfactant is or comprises a polyhydroxy fatty acid, which may be a saturated or unsaturated fatty acid. The polyhydroxy fatty acid may be a $C_8$ to $C_{28}$ polyhydroxy fatty acid, in some examples a $C_{12}$ to $C_{20}$ polyhydroxy fatty acid, in some examples a $C_{18}$ to $C_{20}$ polyhydroxy fatty acid. In some examples, the polyhydroxy fatty acid is a polyhydroxystearic acid. In some examples, the polyhydroxy fatty acid is poly(12-hydroxystearic acid) stearate. In some examples, the surfactant is or comprises Solsperse® 3000, available from Lubrizol. The polyhydroxy fatty acid may have a molecular weight of at least 300 Daltons, in some examples at least 1000 Daltons, in some examples 300 to 24000 Daltons, in some examples 1000 to 24000 Daltons.

In some examples, the surfactant may be selected from anionic surfactant, cationic surfactant, amphoteric surfactant, non-ionic surfactant, polymeric surfactant, oligomeric surfactant, crosslinking surfactant, or combinations thereof.

The anionic surfactant may be or comprise sulfosuccinic acid and derivatives thereof such as, for instance, alkyl sulfosuccinates (e.g., GEROPON® SBFA-30 and GEROPON® SSO-75, both of which are manufactured by Rhodia, Boulogne-Billancourt, France) and docusate sodium.

The cationic surfactant may be selected from quaternary amine polymers, protonated amine polymers, and polymers containing aluminum (such as those that are available from Lubrizol Corp., Wickliffe, Ohio). Further examples of cationic surfactants include SOLSPERSE® 2155, 9000, 13650, 13940, and 19000 (Lubrizol Corp.) and other like cationic surfactants.

The amphoteric surfactant may be selected from surfactants that contain compounds having protonizable groups and/or ionizable acid groups. An example of a suitable amphoteric surfacant includes lecithin.

The non-ionic surfactant may be selected from oil-soluble polyesters, polyamines, polyacrylates, polymethacrylates (such as, e.g., SOLSPERSE® 3000 (Lubrizol Corp.), SOLSPERSE® 21000 (Lubrizol Corp.), or the like.

The oligomeric surfacant may be selected from low average molecular weight (i.e, less than 1000) non-ionic surfactants.

The cross-linking surfactant may be selected from polymers or oligomers containing two or more carbon double bonds (C=C) and/or free amine groups such as, e.g., polyamines, crosslinkable polyurethanes, and divinyl benzene.

Other suitable surfactants include OS #13309AP, OS #13309AQ, 14179BL, and 45479AB from Lubrizol Corp, which are surfacants based on polyisobutylene succinic acid with polyethyleneimines. These surfactants are combination polymers that are cationic in nature.

In some examples, the surfactant is selected from a fatty acid sarcosine and a fatty acid sarcosinate. In some examples, the fatty acid in the fatty acid sarcosine and/or fatty acid sarcosinate is selected from a $C_8$ to $C_{28}$ fatty acid, in some examples a $C_{12}$ to $C_{20}$ fatty acid, in some examples a $C_{18}$ to $C_{20}$ fatty acid. The fatty acid may be saturated or unsaturated. In some examples, the fatty acid in the fatty acid sarcosine and/or fatty acid sarcosinate is selected from lauroyl, cocoyl, myristoyl, oleoyl, and stearoyl. Suitable surfactants may be available from Crodasinic®, for example Crodasinic L, C, M, O, S or SM.

Surfactants typically comprise a head group and a tail group, with the head group and tail group typically of different polarity, e.g. the head group being polar and the tail group being relatively non-polar compared to the head group. The surfactant may comprise an acidic head group, e.g. a head group comprising a carboxylic acid. The surfactant may comprise a basic head group. The basic head group may comprise an amine group, which may be selected from a primary amine group and a secondary amine group. The basic head group may comprise a plurality of amine groups, which may each independently be selected from a primary amine group and a secondary amine group.

In some examples, the surfactant comprises a succinimide. The succinimide may be linked, e.g. via a hydrocarbon-containing linker group, to an amine group. In some examples, the surfactant comprises a polyisobutylene succinimide having a head group comprising an amine.

In some examples, the surfactant is of formula (I)

formula (I)

wherein $R_1$, $R_2$ and $R_3$ are selected from an amine-containing head group, a hydrocarbon tail group and hydrogen,
wherein at least one of $R_1$, $R_2$ and $R_3$ comprises a hydrocarbon tail group,
at least one of $R_1$, $R_2$ and $R_3$ comprises an amine-containing head group. In some examples, $R_1$ and $R_2$ are selected from a hydrocarbon tail group and hydrogen, with at least one of $R_1$ and $R_2$ comprising a hydrocarbon tail group, and $R_3$ comprises an amine-containing head group. The hydrocarbon tail group may comprise or be a hydrocarbon group, which may be branched or straight chain and may be unsubstituted. The hydrocarbon tail group may comprise or be a hydrocarbon group containing a polyalkylene, which may be selected from a polyethylene, polypropylene, polybutylene. In some examples, the hydrocarbon tail group may contain a polyisobutylene. The hydrocarbon tail group may contain from 10 to 100 carbons, in some examples from 10 to 50 carbons, in some examples from 10 to 30 carbons. The hydrocarbon tail group may be of the formula (II)

P-L-    formula (II), wherein P is or comprises polyisobutylene and L is selected from a single bond, $(CH_2)_n$, wherein n is from 0 to 5, in some examples 1 to 5, —O— and —NH—. In some examples, the amine-containing head group comprises or is a hydrocarbon group having an amine group attached to one of the carbons of the hydrocarbon group. In some examples, the amine-containing head group is of the formula (III)

$(CH_2)_m[(CH_2)_oNH(CH_2)_p]_q(CH_2)_r—NH_2$    formula (III), wherein m is at least 1, in some examples 1 to 5, q is 0 to 10, o is 0, 1 or 2, p is 1 or 2, r is 0 to 10; in some examples, m is 1, o is 1, p is 1 and q is from 0 to 10, in some examples from 1 to 5, and in some examples r is 1 to 5; in some examples m is 1, q is 0 to 10, in some examples 1 to 10, in some examples 1 to 5, o is 1, p is 1, r is 1.

In some examples, the surfactant is of formula (I), wherein $R_1$ is of formula (II), $R_2$ is H and $R_3$ is of formula (III). In some examples, the surfactant is of formula (I), wherein $R_1$ is of formula (II), wherein L is —$CH_2$—, $R_2$ is H and $R_3$ is of formula (III), wherein m is 1, q is 0 to 10, in some examples 1 to 10, in some examples 1 to 5, o is 1, p is 1 and r is 1. In some examples, the surfactant is or comprises Lubrizol® 6406.

Method of Producing the Liquid Electrophotographic Ink Composition

In some examples, the method of producing a conductive liquid electrophotographic ink composition involves heating a polymer resin in a carrier fluid to dissolve the polymer resin.

In some examples, the polymer resin is insoluble in a carrier fluid at room temperature but soluble in the carrier fluid at elevated temperatures, for example at a temperature of at least 50° C., for example at a temperature of at least 60° C., for example at a temperature of at least 70° C., for example at a temperature of at least 80° C., for example at a temperature of at least 90° C., for example at a temperature of at least 100° C., for example at a temperature of at least 110° C., for example at a temperature of at least 120° C. The dispersion of the polymer resin in the carrier fluid may be heated to any of the above stated temperatures for sufficient time until the polymer resin has dissolved. Dissolution may be confirmed by the carrier fluid appearing clear and homogenous. In some examples, the dispersion of polymer resin in the carrier fluid may be mixed at a rate of less than 500 rpm, for example less than 400 rpm, for example less than 300 rpm, for example less than 200 rpm until dissolution is complete. In some examples, heating a dispersion of polymer resin in carrier fluid causes the polymer resin to swell with carrier fluid. In some examples, the dispersion of polymer resin in carrier fluid is heated to swell the polymer resin. Swelling of the polymer resin allows better encapsulation of the conductive pigment particle. In some examples, the polymer resin is heated in a solvating carrier liquid to swell and solvate the polymer resin. The swollen and solvated polymer resin may then be removed from the solvating carrier liquid and redispersed in a new portion of carrier fluid.

In some examples, the conductive metallic pigment particles to be coated are added to the carrier fluid. In some examples, the conductive metallic pigment particles to be coated are added to the carrier fluid as a single addition. In some examples, the conductive metallic pigment particles are added to the carrier fluid in a portion-wise manner, over a period of time. In some examples, the conductive metallic pigment particles are added to the carrier fluid over a period of at least 10 minutes, for example at least 20 minutes, for example at least 30 minutes.

In some examples, the conductive metallic pigment particles to be coated are added to the carrier fluid before any heating occurs, for example at room temperature. In some examples, the conductive metallic pigment particles to be coated are added to the carrier fluid while the carrier fluid is being heated.

In some examples, the conductive metallic pigment particles are added to the carrier fluid after it has been heated and the polymer resin has dissolved. In some examples, the conductive metallic pigment particles to be coated are added to the carrier fluid before any cooling occurs, for example at the temperature at which dissolution of the polymer resin in the carrier fluid was carried out. In some examples, the carrier fluid may be cooled to an intermediate temperature before the pigment particles are suspended in the carrier fluid. The intermediate temperature may be any temperature above the cloud point of the solution comprising the carrier fluid and the dissolved polymer resin.

The cloud point of any given carrier fluid-polymer resin system can be readily determined by heating and slowly cooling the solution and is the temperature at which dissolved solids begin to precipitate, giving a phase separation and a cloudy or turbid appearance. In some examples, the solution comprising the carrier fluid and the dissolved polymer resin is cooled to at least 2° C., for example at least 3° C., for example at least 4° C., for example at least 5° C., for example at least 6° C., for example at least 7° C., for example at least 8° C., for example at least 9° C., for example at least 10° C. above the cloud point before the pigment particle dispersion is added to the second portion of the carrier fluid.

In some examples, the conductive metallic pigment particles are added to the carrier liquid with high shear mixing. The high shear process may involve stirring the mixture, for example at a high speed, for example a speed of at least 1000 RPM, in some examples at least 2000 RPM, in some examples at least 5000 RPM, in some examples at least 10,000 RPM, in some examples at least 15,000 RPM, in some examples at least 20,000 RPM. The stirring may be carried out for a period of at least 30 seconds, in some examples at least 1 minute, in some examples at least 2 minutes. In some examples, the stirring may be carried out at least 1,000 RPM for at least 2 minutes, in some examples at least 2,000 RPM for at least 2 minutes.

In some examples, the pigment particles are mixed into the carrier fluid at a speed of 12 000 RPM or less, for example 11 000 RPM or less, for example 10 000 RPM or less, for example 9000 RPM or less to ensure complete dispersion before the precipitation of the polymer resin is effected. In other examples, the pigment particles are mixed into the carrier fluid at a speed of 100 RPM or less, for example 90 RPM or less, for example 80 rpm or RPM, for example 70 RPM or less, for example 60 RPM or less, for example 50 RPM or less to ensure complete dispersion before the precipitation of the polymer resin is effected. In some examples, following dispersion of the pigment particles at a low speed, the rate of mixing may be increased to less than 100 RPM, for example less than 90 RPM, for example less than 80 RPM, for example 70 RPM or less. In some examples, following dispersion of the pigment particles, the rate of mixing may be lowered to less than 500 RPM, for example less than 400 RPM, for example less than 300 RPM, for example less than 200 RPM, for example 100 RPM or less, for example less than 90 RPM, for example less than 80 RPM, for example less than 70 RPM, for example less than 60 RPM, for example 50 RPM or less while the first precipitation is effected.

In some examples, the conductive metallic pigment particles are dispersed in a first portion of a carrier liquid which is later combined with a second portion of the carrier liquid containing the polymer resin. In some examples, the first and second portions of the carrier liquid are identical in nature. In some examples, the carrier liquid, the first portion thereof and the second portion thereof all comprise or consist of an isoparaffinic carrier liquid. In some examples, the first and second portions of the carrier liquid are different solvents, but are miscible with one another and are both suitable carrier liquids for electrostatic printing.

In some examples, the conductive metallic pigment particles are dispersed in the first portion of the carrier liquid with high shear mixing. The high shear process may involve stirring the mixture, for example at a high speed, for example a speed of at least 1000 RPM, in some examples at least 2000 RPM, in some examples at least 5000 RPM, in some examples at least 10,000 RPM, in some examples at least 15,000 RPM, in some examples at least 20,000 RPM. The stirring may be carried out for a period of at least 30 seconds, in some examples at least 1 minute, in some examples at least 2 minutes. In some examples, the stirring may be carried out at least 1,000 RPM for at least 2 minutes, in some examples at least 2,000 RPM for at least 2 minutes.

In some examples, the addition of the conductive metallic pigment particles to the carrier fluid containing the polymer resin as described herein comprises addition of the dispersion of conductive metallic pigment particles in the first portion of carrier liquid.

In some examples, the dispersion of conductive metallic pigment particles in the first portion of carrier liquid is treated with a first polymer resin to partially encapsulate the particles. The first polymer resin may as be described herein. In some examples, the first polymer resin is heated in a carrier fluid to swell and soften the resin particles before being added to the dispersion of conductive metallic pigment particles.

In some examples, the addition of the conductive metallic pigment particles to the carrier fluid containing the polymer resin as described herein comprises addition of the dispersion of conductive metallic pigment particles partially encapsulated in the first polymer resin in the first portion of carrier fluid.

In some examples, once the pigment particles are fully dispersed, the system is cooled at an uncontrolled rate until precipitation of the resin from solution (and onto the pigment particles) is complete. For example, the system is cooled at an uncontrolled rate through the cloud point of the solution to effect precipitation of the polymer resin from solution. In some examples, cooling at an uncontrolled rate comprises cooling at a rate of at least or about 20° C./hour, Such cooling rates can be achieved through the use of heat exchangers and suitable refrigerants. In some examples, the temperature of the carrier fluid is lowered further through a controlled cooling process at a given rate. For example, the temperature of the carrier fluid may be lowered at a rate of less than 7° C. per hour, for example less than 6° C. per hour, for example less than 5° C. per hour, for example less than 4° C. per hour, for example 3° C. per hour.

In some examples, once the solution has cooled to below the cloud point temperature and the polymer resin has precipitated, the system is then reheated to above the cloud point of the solution, for example to at least 5° C. above the cloud point of the solution, for example at least 10° C. above the cloud point of the solution, at least 15° C. above the cloud point temperature of the solution, at least 20° C. above the cloud point temperature of the solution. The reheating of the solution to above the cloud point followed by a second precipitation is thought to improve the final encapsulation of the conductive metallic pigment particle by the polymer resin.

The second precipitation is effected by controlling the cooling of the system such that solubility of the resin in the carrier fluid is reduced and precipitation of the resin occurs. In some examples, the system is cooled at an uncontrolled rate until precipitation of the resin from solution (and onto the pigment particles). For example, the system is cooled at an uncontrolled rate through the cloud point of the solution to effect precipitation of the polymer resin from solution. In some examples, the system is cooled at a rate of 20° C./hour. In some examples, the temperature of the carrier fluid is lowered through a controlled cooling process at a given rate. For example, the temperature of the carrier fluid may be lowered at a rate of less than 7° C. per hour, for example less than 6° C. per hour, for example less than 5° C. per hour, for example less than 4° C. per hour, for example 3° C. per hour.

In some examples, the second precipitation is effected through controlled cooling through the cloud point of the polymer resin-carrier fluid system. For example, the controlled cooling at a rate of less than 7° C./hour, for example a rate of 3° C./hour, may be carried out beginning at a temperature of 5° C. above the cloud point of the solution and continued until a temperature of at least 5° C. below the cloud point of the solution. In some examples, once the temperature has been lowered in a controlled manner to at least 5° C. below the cloud point of the solution, the system is then cooled at an uncontrolled rate to room temperature. In some examples, the second precipitation is effected through cooling at an uncontrolled rate (for example at a rate of 20° C./hour) to at least 5° C. below the cloud point of the solution, followed by controlled cooling at a slower cooling rate, for example at a rate of less than 7° C. per hour, for example less than 6° C. per hour, for example less than 5° C. per hour, for example less than 4° C. per hour, for example 3° C. per hour until precipitation of the resin and concomitant encapsulation of the conductive metallic pigment particle is complete.

In some examples, following the second precipitation of the resin from the carrier fluid, the composition comprising polymer resin-coated conductive metallic pigment particles in carrier fluid may be subjected to a high shear treatment. The high shear process may involve stirring the mixture, for example at a high speed, for example a speed of at least 1000 RPM, in some examples at least 5000 RPM, in some examples at least 5000 RPM, in some examples at least 10,000 RPM, in some examples at least 15,000 RPM, in some examples at least 20,000. The stirring may be carried out for a period of at least 30 seconds, in some examples at least 1 minute in some examples at least 2 minutes. In some examples, the stirring may be carried out at least 10,000 RPM for at least 2 minutes, in some examples at least 20,000 RPM for at least 2 minutes.

In some examples, the composition comprising polymer resin-coated conductive metallic pigment particles in carrier fluid obtained from the method is suitable for use as a printing composition without further treatment, in particular without a grinding treatment. In some examples, the composition comprising polymer resin-coated conductive metallic pigment particles in carrier fluid obtained from the method is diluted with additional carrier liquid to a required pigment loading, for example at least 15 wt. %, for example at least 20 wt. %, at least 25 wt. %, at least 30 wt. % based on the total solids of the composition.

Liquid Electrophotographic Composition

In some examples, the composition resulting from the second precipitation of the resin from the carrier fluid is suitable for use as or is converted to an electrostatic ink composition, before or after the optional high shear treatment step. The electrostatic ink composition may be a dry toner or a liquid toner composition. The electrostatic ink composition may comprise coated particles comprising the resin and the conductive metallic pigment particles. In some examples, a particle comprises conductive metallic pigment particles having a coating of the resin thereon. In some examples, the coating of resin on the pigment particles partially or completely encapsulates the conductive metallic pigment particles. In some examples, the electrostatic ink composition may comprise particles comprising the resin and the conductive metallic pigment particles, wherein at least some of the conductive metallic pigment particles are completely encapsulated by the coating of the resin. In some examples, the composition resulting from the precipitation of the resin from the liquid carrier is suitable for use as or is converted to an electrostatic ink composition by removing the liquid to leave dry particles, comprising the resin and the coated conductive metallic pigment particles. The particles may be capable of developing a charge from the nature of the resin, e.g. if the resin has acidic side groups, to become chargeable particles. In some examples, an electrostatic ink composition may comprise a charge director. In some examples, a charge director may be present in the carrier liquid before precipitation of the resin. In some examples, a charge director is added during or after precipitation of the resin. In some examples, a charge director is added to the composition resulting from the precipitation of the resin from the liquid carrier to convert it to an electrostatic ink composition.

In some examples, the conductive metallic pigment particles, excluding any coating thereon, constitute 60% or less by weight of the solids in the electrostatic ink composition or composition resulting from the method, for example 55% or less by weight of the solids in the electrostatic ink composition or composition resulting from the method, for example 54% or less by weight of the solids in the electrostatic ink composition or composition resulting from the method, for example 53% or less by weight of the solids in the electrostatic ink composition or composition resulting from the method, for example 52% or less by weight of the solids in the electrostatic ink composition or composition resulting from the method, for example 51% or less by weight of the solids in the electrostatic ink composition or composition resulting from the method, for example 50% or less by weight of the solids in the electrostatic ink composition or composition resulting from the method, which may be an electrostatic ink composition.

In some examples, the conductive metallic pigment particles, including any coating thereon, constitute 60% or less by weight of the solids in the electrostatic ink composition or composition resulting from the method, for example 55% or less by weight of the solids in the electrostatic ink composition or composition resulting from the method, for example 54% or less by weight of the solids in the electrostatic ink composition or composition resulting from the method, for example 53% or less by weight of the solids in the electrostatic ink composition or composition resulting from the method, for example 52% or less by weight of the solids in the electrostatic ink composition or composition resulting from the method, for example 51% or less by weight of the solids in the electrostatic ink composition or composition resulting from the method, for example 50% or less by weight of the solids in the electrostatic ink composition or composition resulting from the method, which may be an electrostatic ink composition.

The present disclosure further relates to a liquid electrophotographic ink composition producible in accordance with a method described herein.

In some examples, the composition resulting from the precipitation of the resin from the liquid carrier is suitable for use as or is converted to a liquid electrophotographic ink composition.

The present disclosure also relates to a method of electrostatic printing using an electrostatic ink composition as described herein, which may result from the method described herein, the electrostatic ink composition comprising resin-coated conductive metallic pigment particles, the method comprising:

forming a latent electrostatic image on a surface;
contacting the surface with the electrostatic ink composition, such that at least some of the particles adhere to the surface to form a developed toner image on the surface, and transferring the toner image to a print substrate, in some examples, via an intermediate transfer member.

The surface on which the latent electrostatic image is formed may be on a rotating member, e.g. in the form of a cylinder. The surface on which the latent electrostatic image is formed may form part of a photo imaging plate (PIP). The intermediate transfer member may be a rotating flexible member, which may be heated, e.g. to a temperature of from 80 to 130° C. The print substrate may be or comprise a cellulosic print substrate such as paper. The cellulosic print substrate may be or comprise an uncoated cellulosic print substrate, i.e. absent of a coating of a polymeric material. The print substrate may be an acrylic print substrate, in some examples a coated acrylic print substrate, e.g. coated with a styrene-butadiene co-polymer.

EXAMPLES

The following illustrates examples of the methods and related aspects described herein. Thus, these examples should not be considered as limitations of the present disclosure, but are merely in place to teach how to make examples of compositions of the present disclosure. As such, a representative number of compositions and their method of manufacture are disclosed herein.

Liquid Electrophotographic Ink Compositions

Materials

Resins: Nucrel 599 is an ethylene-methacrylic acid copolymer available from DuPont. AC-5120 is an ethylene acrylic acid copolymer resin available from Honeywell.

Pigments: Silver dollar 12541 pigment is available from Schleck (Germany).

Solvent: Isopar-L is available from Exxon-Mobil.

Example 1

A general procedure for coating pigment particles is described.

To prepare a 1.5 kg batch of coated particles, 300 g resin, 1050 g Isopar-L and 150 g pigment were used to obtain a pigment loading level of 30%.

In a first step, the pigment (Silver $12541) is dispersed in Isopar-L using a T25 digital ULTRA-TURRAX® homogenizer from IKA @ 15K rpm, followed by addition of a dispersion of hot (120° C.) AC-5120 resin in Isopar-L, which leads to partial encapsulation of the pigment flakes.

The encapsulation procedure then takes place in a Kinematica Reactron RT2, sealed vessel with anchor mixing blades with scrapers which wipe the surface of the vertical cylindrical vessel wall to create good circulation of the material to be dissolved or dispersed and minimized temperature differential between the wall and the bulk due to disruption of the viscous boundary layer at the wall. It is equipped with a heating jacket to allow the process to be carried out under controlled conditions of temperature programming.

The encapsulation procedure is initiated by the complete swelling of the main resin (Nucrel 599) at 120° C., followed by the addition of the pretreated encapsulated flakes.

The first cooling step then takes place, at a cooling rate of −20° C./hr.

When the cloud point is reached and the temperature drops to approximately 5° C. below the cloud point, the cooling rate is slowed to approximately 5° C./hr and continued until precipitation is complete.

At this stage, the system is reheated to about 20° C. above the cloud point of the solution, and then cooled, again at a cooling rate of −20° C./hr until the temperature drops to approximately 5° C. below the cloud point. At this time, the cooling rate is slowed to approximately 5° C./hr and continued to room temperature. This second heating and cooling step, with the subsequent slow cooling rate, provides better encapsulation of the particles, and results in a reduction of the background when the composition is printed onto a substrate.

The composition obtained is then treated to a high shear mixing step L using a T25 digital ULTRA-TURRAX® homogenizer from IKA @ 15K rpm for 50 minutes.

Comparative Example 1

A comparative example was prepared by grinding the same starting components in a 5l attritor at 35° C. at 250 rpm for 5 hours.

Results

The following test was performed on each in order to characterize the ink before printing in press:

Particle Charge PC (Level and Spikes), Low Field Conductivity (LF), High Field Conductivity (HF) and DC (Direct Current Conductivity);

Low field conductivity is the electrical conductivity of ElectroInk measured at the following conditions:

Electrical field amplitude: 5-15 V/mm
Frequency: 5-15 Hz
Temperature: 23+/−2 C

High field conductivity is the maximum electrical conductivity of ElectroInk measured at the following conditions:

Electrical field pulse:
　Shape: Rectangular
　Height: 1500 V/mm
　Duration: 8 sec
　Rise time: 1 ms or less
　Ripple: 10 V/mm or less
Sampling frequency: 1000 per second
Temperature: 23+/−2 C DC (direct current) conductivity is the average conductivity measured between 6.4 and 7.2 seconds.

Particle conductivity is the difference between the High field conductivity and the low field conductivity.

The two compositions were also printed onto a paper substrate using an HP Indigo press, and the following properties measured:

The optical density (OD) is measured on the ink printed on paper and is a characteristic of the color strength of the ink. It is measured by spectrometer at an angel of 45 degrees. Optical Density (OD) is given by the equation $$OD = -\text{Log}\left(\frac{\text{Reflected Light}}{\text{Incident Light}}\right)$$

Flop Index is a measure of the change in reflectance of a metallic color as it is rotated through the range of viewing angles. There are several flop index equations, but most are based on the difference between the reflectance near specular and the reflectance far from specular, all divided by the reflectance at an intermediate angle.

In the present inventors' x-rite measuring device, the following equation is used for calculating flop index:

$$\text{Flop Index} = \frac{2.69(L^*_{0.15°} - L^*_{110°})^{1.11}}{(L^*_{45°})^{0.86}}$$

Table 1 below provides experimentally determined parameters for the above described Example and Comparative Example 1, which confirms that a composition prepared according to the Example demonstrates a higher metallic appearance.

TABLE 1

| Parameter | Example 1 | Comparative Example 1 |
| --- | --- | --- |
| Flop Index | 12 | 9 |
| OD | 0.48 | 0.48 |
| PC | 43 | 150 |

While the compositions, methods and related aspects have been described with reference to certain examples, those skilled in the art will appreciate that various modifications, changes, omissions, and substitutions can be made without departing from the spirit of the disclosure. It is intended, therefore, that the invention be limited by the scope of the following claims. The features of any dependent claim may be combined with the features of any of the other dependent claims or any and/or any of the independent claims.

The invention claimed is:

1. A method for producing a conductive liquid electrophotographic ink composition, the method comprising:
   heating a polymer resin in a carrier fluid to dissolve the polymer resin;
   adding conductive metallic pigment flakes to be coated to the carrier fluid;
   cooling the carrier fluid to effect precipitation of the polymer resin from the carrier fluid such that a coating of the resin is at least partially formed on the conductive metallic pigment flakes to form a suspension of at least partially coated conductive metallic pigment flakes in the carrier fluid;
   reheating the suspension of at least partially coated conductive metallic pigment flakes in the carrier fluid to a temperature at least 5° C. above a cloud point of the suspension; and
   cooling the suspension at a rate of at least or about 20° C. per hour to a temperature at least 5° C. below the cloud point, followed by cooling at a controlled rate of less than 7° C. per hour to effect precipitation of the polymer resin from the carrier fluid such that a coating of the resin is formed on the conductive metallic pigment flakes, thereby producing the conductive liquid electrophotographic ink composition.

2. A method according to claim 1, wherein the conductive metallic pigment flakes are dispersed in a further portion of carrier fluid prior to being added to the carrier fluid and polymer resin.

3. A method according to claim 1, wherein the carrier fluid is heated to at least 100° C. to dissolve the polymer resin.

4. A method according to claim 1, wherein the conductive metallic pigment flakes comprise aluminum flakes.

5. A method according to claim 1, wherein the polymer resin comprises a polymer having acidic side groups.

6. A method according to claim 1, wherein the polymer resin comprises a copolymer of an alkylene monomer and a comonomer selected from the group consisting of acrylic acid and methacrylic acid.

7. A method according to claim 1, wherein cooling the carrier fluid to effect precipitation of the polymer resin such that a coating of the resin is at least partially formed on the conductive metallic pigment flakes comprises cooling to below the cloud point of the solution at a rate of at least 20° C./hour followed by controlled cooling at a rate of no more than 5° C./hour.

8. A method according to claim 1, wherein cooling the carrier fluid at a controlled rate comprises cooling the carrier fluid at a rate of no more than 5° C./hour.

9. A method according to claim 1, further comprising subjecting the polymer resin coated conductive metallic pigment flakes to high shear mixing after the reheating and cooling such that, the coating of the resin is formed on the conductive metallic pigment flakes.

10. A method according to claim 1, wherein the conductive metallic pigment flakes are added to the carrier fluid before, during or after heating the polymer resin in carrier fluid to dissolve the polymer resin.

11. A method according to claim 1 or 2, wherein the conductive metallic pigment flakes to be coated are dispersed in the carrier fluid with high shear mixing.

12. A method according to claim 1, wherein the composition resulting from cooling at a controlled rate is suitable for use as or is converted to an liquid electrophotographic ink composition without a further step of grinding.

13. A method according to claim 1, wherein the conductive metallic pigment flakes are not subjected to a grinding treatment.

14. A method according to claim 1, wherein the conductive metallic pigment flakes have a thickness from 0.01 μm to 1 μm and an aspect ratio from 2 to 100.

15. A method according to claim 1, wherein the conductive metallic pigment flakes comprise aluminum, tin, zinc, copper, silver, gold, nickel, palladium, platinum, iron, or a combination thereof.

16. A method according to claim 1, wherein the cooling at a controlled rate is continued to room temperature.

* * * * *